(12) United States Patent
Huh et al.

(10) Patent No.: US 9,142,415 B2
(45) Date of Patent: Sep. 22, 2015

(54) DEPOSITION APPARATUS, METHOD OF FORMING THIN FILM USING THE DEPOSITION APPARATUS, AND METHOD OF MANUFACTURING ORGANIC LIGHT EMITTING DISPLAY APPARATUS USING THE DEPOSITION APPARATUS

(71) Applicant: Samsung Display Co., Ltd., Yongin, Gyeonggi-Do (KR)

(72) Inventors: Myung-Soo Huh, Yongin (KR); Suk-Won Jung, Yongin (KR); Sung-Chul Kim, Yongin (KR); Sang-Hyuk Hong, Yongin (KR); Choel-Min Jang, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/269,175

(22) Filed: May 4, 2014

(65) Prior Publication Data

US 2015/0031167 A1   Jan. 29, 2015

(30) Foreign Application Priority Data

Jul. 25, 2013   (KR) ........................ 10-2013-0088265

(51) Int. Cl.
*H01L 21/285* (2006.01)
*H01L 21/02* (2006.01)
H01L 51/56 (2006.01)
H01L 51/00 (2006.01)

(52) U.S. Cl.
CPC .... *H01L 21/28506* (2013.01); *H01L 21/02274* (2013.01); *H01L 51/001* (2013.01); *H01L 51/56* (2013.01)

(58) Field of Classification Search
None
See application file for complete search history.

(56) References Cited

U.S. PATENT DOCUMENTS

| 6,911,779 | B2 | 6/2005 | Madocks |
| 2004/0231590 | A1 | 11/2004 | Ovshinsky |
| 2008/0139003 | A1 | 6/2008 | Pirzada et al. |
| 2010/0037820 | A1* | 2/2010 | Lee .............................. 118/719 |
| 2010/0068413 | A1 | 3/2010 | Lee |
| 2012/0164353 | A1 | 6/2012 | Madocks |

FOREIGN PATENT DOCUMENTS

| KR | 1020100054502 A | 5/2010 |
| KR | 1020120034705 A | 4/2012 |
| KR | 1020120085254 A | 7/2012 |

* cited by examiner

*Primary Examiner* — Kyoung Lee
(74) *Attorney, Agent, or Firm* — Cantor Colburn LLP

(57) ABSTRACT

A deposition apparatus for performing a deposition process on a substrate includes: an injection unit including a plasma generating member which receives a raw material gas and converts the raw material gas to a deposition source material in a radical form; and a plasma processor disposed adjacent to the injection unit and facing a side of the injection unit, wherein the plasma processor performs a plasma process in a direction facing the substrate.

29 Claims, 7 Drawing Sheets

DEPOSITION APPARATUS, METHOD OF FORMING THIN FILM USING THE DEPOSITION APPARATUS, AND METHOD OF MANUFACTURING ORGANIC LIGHT EMITTING DISPLAY APPARATUS USING THE DEPOSITION APPARATUS

This application claims priority to Korean Patent Application No. 10-2013-0088265, filed on Jul. 25, 2013, and all the benefits accruing therefrom under 35 U.S.C. §119, the content of which in its entirety is herein incorporated by reference.

BACKGROUND

1. Field

One or more embodiments of the invention relate to a deposition apparatus, a method of forming a thin film using the deposition apparatus, and a method of manufacturing an organic light emitting display apparatus using the deposition apparatus, and more particularly, to a deposition apparatus which efficiently performs a deposition process and improves characteristics of a deposition film, a method of forming a thin film using the deposition apparatus, and a method of manufacturing an organic light emitting display apparatus using the deposition apparatus.

2. Description of the Related Art

Semiconductor devices, display apparatuses and other electronic devices include a plurality of thin films. One of various methods of forming the plurality of thin films is a deposition method.

In the deposition method, various raw materials for forming thin films may be used, such as a gas. The deposition method includes a chemical vapor deposition ("CVD") method and an atomic layer deposition ("ALD") method, for example.

An organic light emitting display apparatus is one of the display apparatuses that receive attention as a next generation display apparatus due to a wide viewing angle, high contrast and a quick response speed.

The organic light emitting display apparatus includes an intermediate layer that includes an organic emission layer between first and second electrodes facing each other, and at least one of various thin films. Here, a deposition process may be performed to form a thin film of the organic light emitting display apparatus.

However, as the organic light emitting display apparatus becomes larger with high resolution, forming a large thin film having a desired characteristic may not be effectively performed with high efficiency of a process.

SUMMARY

One or more embodiments of the invention include a deposition apparatus capable of efficiently performing a deposition process and easily improving characteristics of a deposition film, a method of forming a thin film using the deposition apparatus, and a method of manufacturing an organic light emitting display apparatus using the deposition apparatus.

Additional aspects will be set forth in part in the description which follows and, in part, will be apparent from the description, or may be learned by practice of the presented embodiments.

According to an exemplary embodiment of the invention, a deposition apparatus for performing a deposition process on a substrate includes: an injection unit including a plasma generating member which receives a raw material gas and converts the raw material gas to a deposition source material in a radical form; and a plasma processor disposed adjacent to the injection unit and facing a side of the injection unit, where the plasma processor performs a plasma process in a direction facing the substrate.

In an exemplary embodiment, the plasma generating member may have a hollow pillar shape, and the deposition apparatus may further include a filament member disposed inside the plasma generating member.

In an exemplary embodiment, the injection unit may further include a support bar which supports the filament member, where the filament member may be wound up on the support bar.

In an exemplary embodiment, the deposition apparatus may further include an intermediate unit disposed between the plasma generating member and the filament member, and having a hollow pillar shape.

In an exemplary embodiment, a plurality of first holes may be defined in the intermediate unit in a region facing the substrate, and a plurality of second holes may be defined in the intermediate unit in a region facing away from the substrate.

In an exemplary embodiment, the plasma generating member may include a nozzle facing the substrate, and an inlet hole facing away from the substrate.

In an exemplary embodiment, the plasma generating member may receive a voltage.

In an exemplary embodiment, the plasma processor may include a first plasma processor and a second plasma processor, which are disposed on two sides of the injection unit, respectively.

In an exemplary embodiment, the deposition process may be performed on the substrate as the substrate moves with respect to the deposition apparatus, and the plasma processor may be disposed on a side of the injection unit substantially in parallel to a moving direction of the substrate.

In an exemplary embodiment, the deposition process may be performed on the substrate as the injection unit and the plasma processor integrally move with respect to the substrate, and the plasma processor may be disposed on a side of the injection unit substantially in parallel to a moving direction of the injection unit and plasma processor.

In an exemplary embodiment, the plasma processor may include an electrode member which generates plasma and a base member which supports the electrode member.

In an exemplary embodiment, a reaction space may be defined between the electrode member and the base member, and the plasma may be generated in the reaction space.

In an exemplary embodiment, the reaction space may be separated from the injection unit.

In an exemplary embodiment, a through hole may be defined in the base member, and a reaction gas to generate the plasma may be supplied through the through hole.

In an exemplary embodiment, the deposition apparatus may further include a diffuser disposed between the base member and the electrode member, and a plurality of dispersion holes is defined on the diffuser.

In an exemplary embodiment, the electrode member may include a cooling line disposed an inside thereof.

In an exemplary embodiment, the injection unit may include a housing disposed to correspond to a surface of the plasma generating member, and the base member and the housing may be integrally formed as a single unitary and indivisible unit.

In an exemplary embodiment, a plurality of slits may be defined in the electrode member.

In an exemplary embodiment, the injection unit and the plasma processor may be disposed closer to or farther from a surface of a ground than the substrate.

In an exemplary embodiment, the injection unit, the plasma processor and the substrate may be disposed substantially perpendicular to a surface of the ground.

According to another exemplary embodiment of the invention, a method of forming a thin film on a substrate using a deposition apparatus, the method includes: receiving a raw material gas, converting the raw material gas to a deposition source material in a radical form, and supplying the deposition source material to the substrate using a plasma generating member of an injection unit of the deposition apparatus; and performing a plasma process in a direction facing the substrate using a plasma processor of the deposition apparatus, where the plasma processor is disposed adjacent to the injection unit and facing a side of the injection unit.

In an exemplary embodiment, the performing the plasma process may include using the raw material gas.

In an exemplary embodiment, the performing the plasma process may include using a gas different from the raw material gas.

In an exemplary embodiment, the performing the plasma process may include using a gas selected independently of a material in the thin film.

In an exemplary embodiment, the plasma generating member may have a hollow pillar shape, the deposition apparatus may include a filament disposed inside the plasma generating member, and the filament member may emit heat and thermions.

According to another exemplary embodiment of the invention, a method of manufacturing an organic light emitting display apparatus using a deposition apparatus includes: providing a layer on a substrate of the organic light emitting display apparatus, where the providing the layer includes: receiving a raw material gas, converting the raw material gas to a deposition source material in a radical form, and supplying the deposition source material to the substrate using a plasma generating member of an injection unit of the deposition apparatus; and performing a plasma process in a direction facing the substrate using a plasma processor of the deposition apparatus, where the plasma processor disposed adjacent to the injection unit and facing a side of the injection unit.

In an exemplary embodiment, the organic light emitting display apparatus may include: a first electrode; an intermediate layer including an organic emission layer; a second electrode; and an encapsulation layer, and the providing the layer may further include providing the encapsulation layer on the second electrode disposed on the substrate.

In an exemplary embodiment, the providing the layer may further include providing an insulating film.

In an exemplary embodiment, the providing the layer may further include providing a conductive film.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
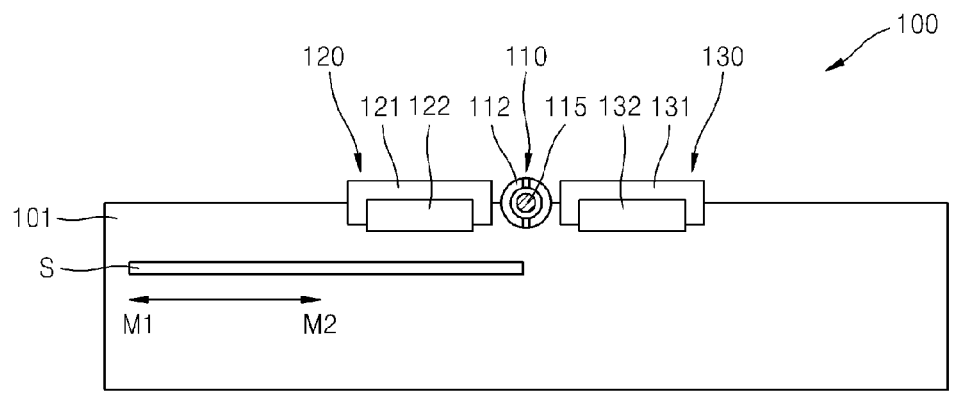
FIG. 1 is a schematic diagram showing an exemplary embodiment of a deposition apparatus, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
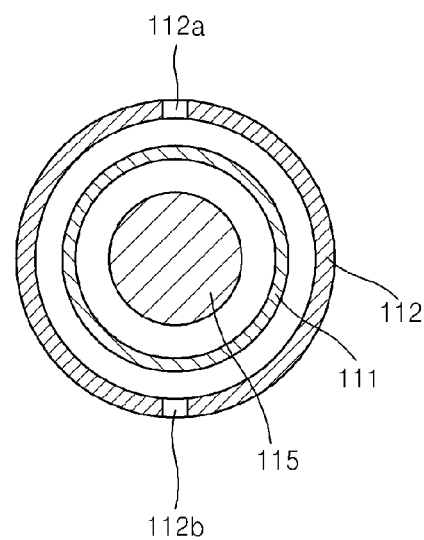
FIG. 2 is an enlarged view of an injection unit of FIG. 1.

FIG. 1 is a schematic diagram showing an exemplary embodiment of a deposition apparatus 100, according to the invention, and FIG. 2 is an enlarged view of an injection unit 110 of FIG. 1.

Referring to FIGS. 1 and 2, the deposition apparatus 100 includes the injection unit 110 and a plasma processor unit. The plasma processor unit includes a first plasma processor 120 and a second plasma processor 130.

In an exemplary embodiment, the deposition apparatus 100 may include a chamber 101 to effectively control atmosphere of a deposition process. In such an embodiment, the injection unit 110 and the first and second plasma processors 120 and 130 may be disposed in the chamber 101. Here, the injection unit 110 and the first and second plasma processors 120 and 130 may be disposed to face the inside (e.g., a predetermined portion of inner space) of the chamber 101 such that at least the deposition process is performed in the chamber 101.

The chamber 101 may be connected to a pump (not shown) to control a pressure atmosphere of the deposition process, and may include an entry hole (not shown) through which a substrate S may be provided thereinto, e.g., enter thereinto.

The injection unit 110 injects a deposition source material into the substrate S to form a deposition film on the substrate S.

In an exemplary embodiment, the injection unit 110 includes a plasma generating member 112. The plasma generating member 112 includes an inlet hole 112a and a nozzle 112b. The nozzle 112b is defined, e.g., formed, in a bottom portion of the plasma generating member 112 to face the substrate S, and the inlet hole 112a is defined opposite to the nozzle 112b, e.g., in a top portion of the plasma generating member 112.

In such an embodiment, a raw material gas is transmitted to an inner space of the plasma generating member 112 through the inlet hole 112a. The raw material gas is converted to a deposition source material in a radical form by the plasma generating member 112, and the deposition source material is transmitted to the substrate S through the nozzle 112b of the plasma generating member 112 to form a deposition film on the substrate S.

The plasma generating member 112 may function as an electrode to which a voltage is applied. In such an embodiment, the plasma generating member 112 may have a hollow pillar shape, for example.

In an alternative exemplary embodiment, a filament member 111 may be further included in the plasma generating member 112. In such an embodiment, the filament member 111 is disposed in the inner space of the plasma generating member 112 having the hollow pillar shape. In such an embodiment, a power source (not shown) for applying power may be connected to the filament member 111, such that heat and thermions are emitted from the filament member 111. In such an embodiment, the heat and thermions generate secondary electrons by colliding with a gas around the filament member 111.

The filament member 111 may include a material having a high electron emission coefficient, for example, a metal material or a ceramic material, but not being limited thereto. In one exemplary embodiment, for example, the metal material of the filament member 111 may include tungsten, tantalum, titanium, or a combination thereof. In one exemplary embodiment, for example, the ceramic material of the filament member 11 may include lanthanum hexaboride ($LaB_6$), barium oxide (BaO), strontium oxide (SrO), or a combination thereof.

The filament member 111 is supported by a support bar 115. In an exemplary embodiment, as shown in FIG. 2, the filament member 111 and the support bar 115 are spaced apart from each other. In an alternative exemplary embodiment, the filament member 111 and the support bar 115 may contact each other, e.g., at least a portion of the filament member 111 and the support bar 115 may be in contact with each other, such that the filament member 111 may be stably disposed by the support bar 115. In such an embodiment, the filament member 111 may be wound up on the support bar 115 a plurality of times in a single direction such that the filament member 111 may have a shape of a coil.

In such an embodiment, where the filament member 111 includes the material having a high electron emission coefficient, the filament member 111 emits thermions. Such heat and thermions allows the raw material gas received from the inlet hole 112a of the plasma generating member 112 to be effectively and efficiently converted to a radical form. In such an embodiment, an amount of the raw material gas converted to the radical form is increased and a converting speed is increased.

In an exemplary embodiment, a temperature on a surface of the filament member 111 may be increased up to 1,500° C. such that radiant heat emitted from the filament member 111 increases converting efficiency of the raw material gas to the radical form.

In such an embodiment, the heat and thermions emitted from the filament member 111 collide with adjacent gases, e.g., the raw material gas and an inert gas for generating plasma, to generate secondary electrons, and such secondary electrons also increase the converting efficiency of the raw material gas to the radical form.

Each of the first and second plasma processors 120 and 130 are disposed on a side of the injection unit 110. In an exemplary embodiment, the first and second plasma processors 120 and 130 are disposed adjacent to the injection unit 110 and to face two sides of the injection unit 110, respectively.

The first plasma processor 120 includes a base member 121 and an electrode member 122. The electrode member 122 of the first plasma processor 120 generates plasma. The base member 121 of the first plasma processor 120 supports the electrode member 122 of the first plasma processor 120. The second plasma processor 130 includes a base member 131 and an electrode member 132. The electrode member 132 of the second plasma processor 130 generates plasma. The base member 131 of the second plasma processor 130 supports the electrode member 132 of the second plasma processor 130.

The first or second plasma processor 120 or 130 performs a plasma process on a deposition film using the deposition source material in the radical form on the substrate S through the injection unit 110. In an exemplary embodiment, by performing the plasma process on the deposition film formed through the injection unit 110, purity of the deposition film may be increased and impurities may be removed from the deposition film, thereby substantially improving characteristics of the deposition film.

Operations and effects of such an embodiment of the deposition apparatus 100 shown in FIGS. 1 and 2 will now be described in greater detail.

When the substrate S, which is a deposition target object, is put into the chamber 101 and disposed to correspond to the injection unit 110, the deposition process is performed on the substrate S. In an exemplary embodiment, as shown in FIG. 1, the deposition process may be performed while the substrate S is moved in a first direction M1 or a second direction M2 opposite to the first direction M1. In an alternative exemplary embodiment, the deposition process may be performed while the substrate S is fixed.

At least some of the raw material gas received through the inlet hole 112a of the injection unit 110 is converted to the deposition source material in the radical form by the plasma generating member 112. The deposition source material is injected into the substrate S through the nozzle 112b to form a deposition film. In such an embodiment, the heat and thermions emitted from the filament member 111 increases the converting efficiency of the raw material gas to the radical form. Accordingly, the characteristics of the deposition film are substantially improved.

In an exemplary embodiment, the first and second plasma processors 120 and 130 are disposed adjacent to the injection unit 110 and generate plasma to improve the converting efficiency of the raw material gas to the radical form. In such an embodiment, where the first and second plasma processors 120 and 130 are disposed adjacent to the injection unit 110 in the first or second direction M1 or M2, for example, when the substrate S is moved in the first direction M1, the substrate S corresponds to the second plasma processor 130 after the deposition process is performed through the injection unit 110, and a plasma process is performed on the substrate S through the second plasma processor 130. Accordingly, a material that is not completely converted to a radical form on the substrate S is converted to a radical form, thereby substantially improving purity of the deposition film.

The first plasma processor 120 operates in the same manner as the second plasma processor 130 described above when the substrate S is moved in the second direction M2.

In an exemplary embodiment, the first and second plasma processors 120 and 130 may generate plasma by receiving various gases, for example, gases including the raw material gas supplied from the injection unit 110. In such an embodiment, the injection unit 110 and the first and second plasma processors 120 and 130 convert the raw material gas to the deposition source material in the radical form a plurality of times, and thus the converting efficiency of the raw material gas to the deposition source material is substantially improved. As a result, the characteristics of the deposition film are substantially improved.

In one exemplary embodiment, for example, when a deposition film containing silicon nitride ($Si_xN_y$) is formed on the substrate S, silane ($SiH_4$), ammonia ($NH_3$) or nitrogen gas ($N_2$) may be used as the raw material gas. In such an embodiment, when $NH_3$ or $N_2$ that are relatively difficult to be converted to a radical form are included the raw material gas, the raw material gas including $NH_3$ or $N_2$ is supplied through the injection unit 110, and also through the first and second plasma processors 120 and 130, such that the raw material gas is converted to the radical form using the injection unit 110 and the first and second plasma processors 120 and 130 and injected into the substrate S. Accordingly, the characteristics of the deposition film are substantially improved.

However, embodiments of the invention are not limited thereto. In an alternative exemplary embodiment, the first and second plasma processors 120 and 130 may generate plasma using a gas different from the raw material gas supplied from the injection unit 110, e.g., a gas selected independently of the raw material of the deposition film. In such an embodiment, the first and second plasma processors 120 and 130 may use an argon (Ar) gas, for example, to generate plasma.

In such an embodiment, by improving the converting efficiency from the raw material gas to the deposition source material, the deposition film is effectively and efficiently formed on the substrate S with predetermined characteristics.

Figure 3:
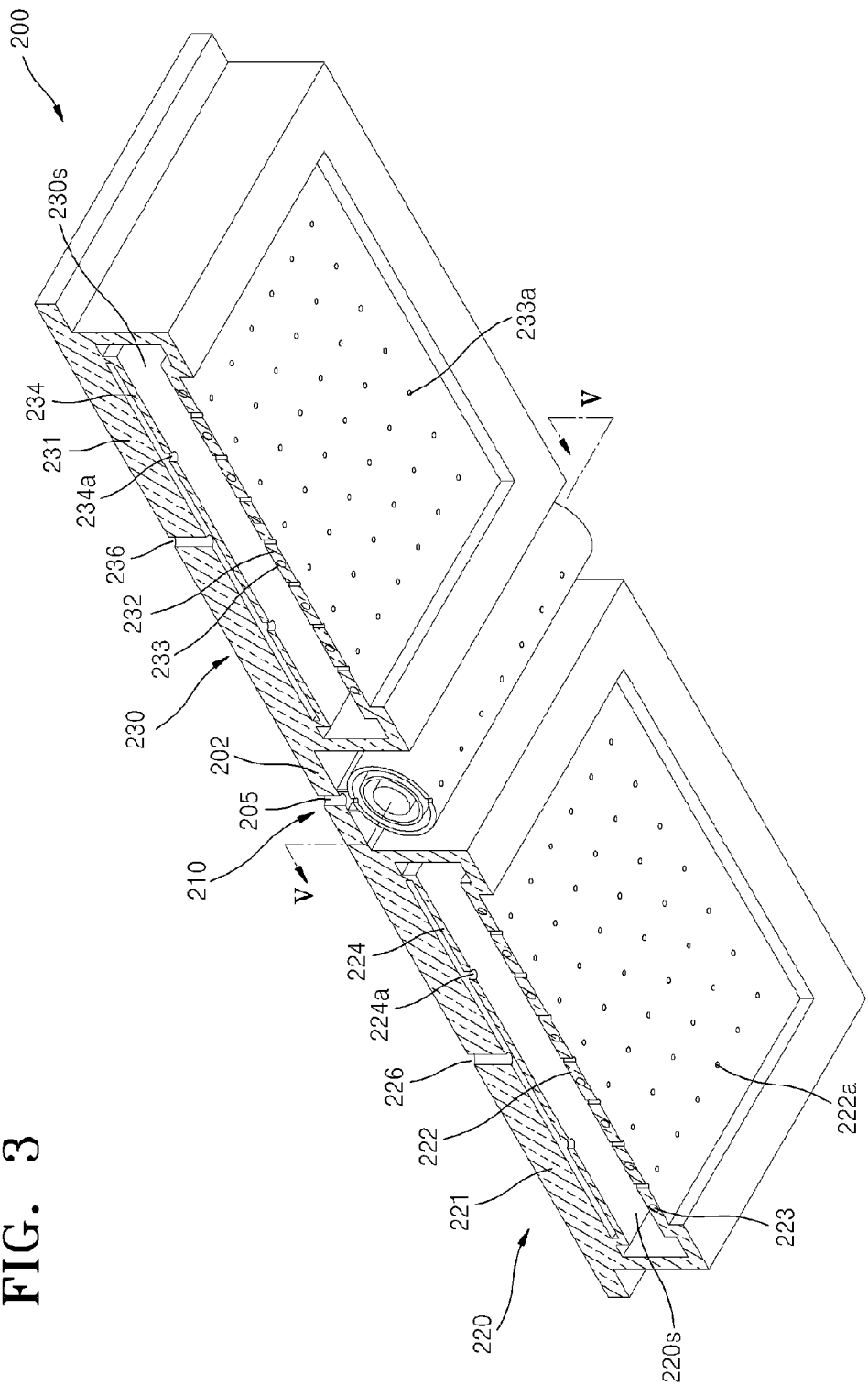
FIG. 3 is a perspective view schematically illustrating an alternative exemplary embodiment of a deposition apparatus, according to the invention.
Figure 4:
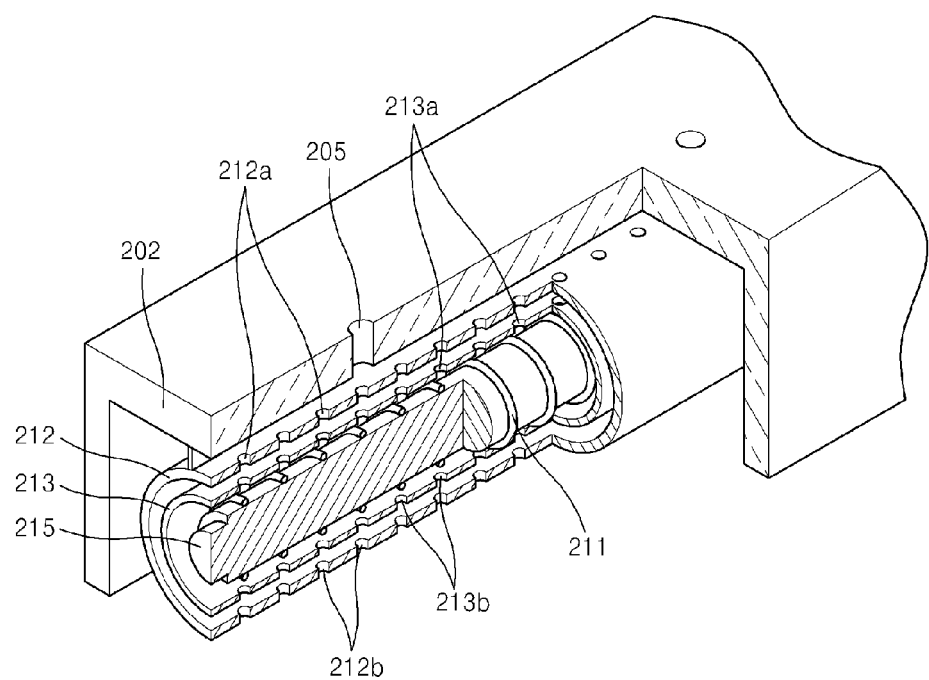
FIG. 4 is an enlarged view of an injection unit of FIG. 3.

FIG. 3 is a perspective view schematically illustrating an alternative exemplary embodiment of a deposition apparatus 200, according to the invention. FIG. 4 is an enlarged view of an injection unit 210 of FIG. 3, and FIG. 5 is a cross-sectional view taken along line V-V of FIG. 3.

Figure 5:
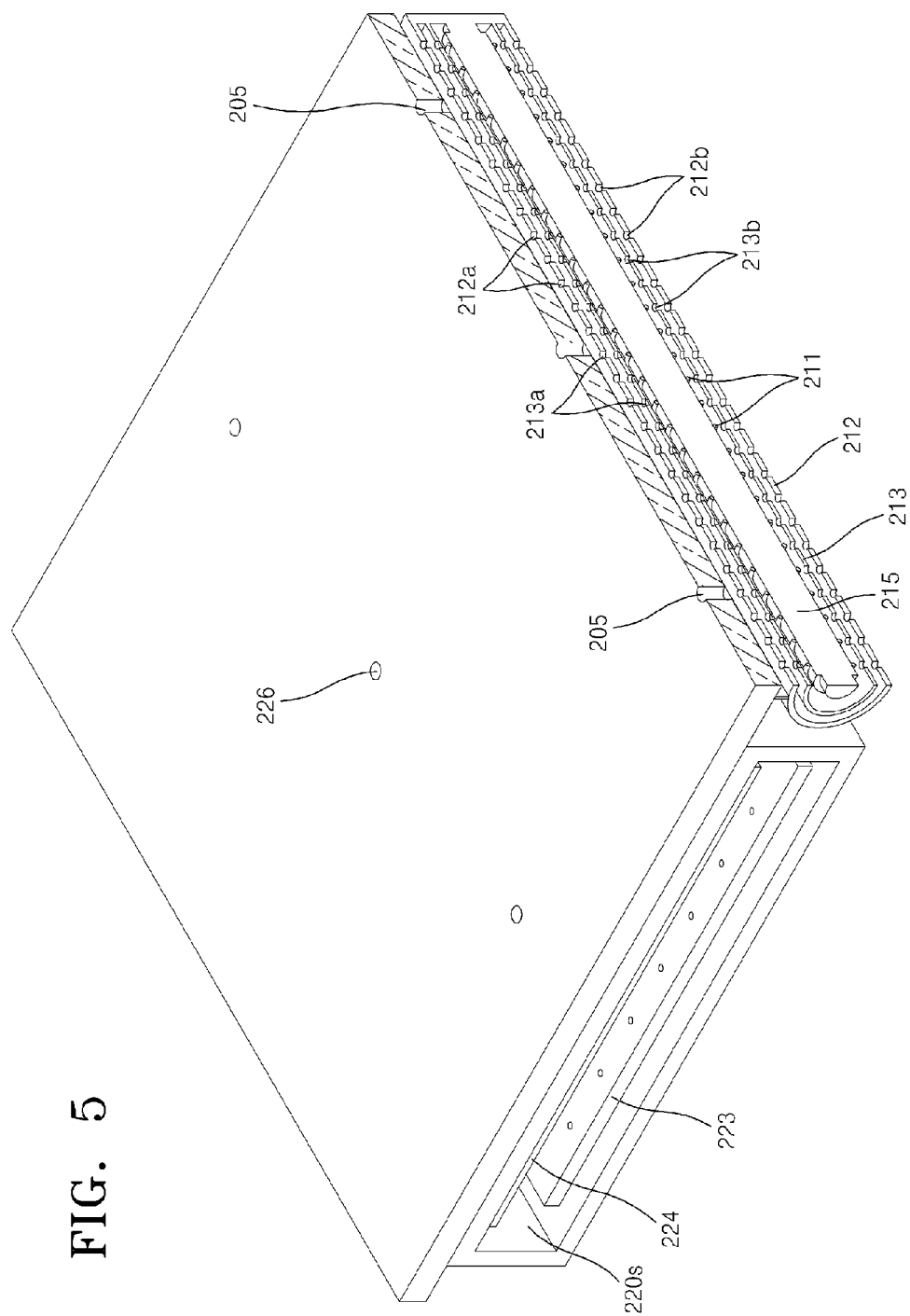
FIG. 5 is a cross-sectional view taken along line V-V of FIG. 3.

Referring to FIGS. 3 through 5, the deposition apparatus 200 includes the injection unit 210 and a plasma processor. The plasma processor includes a first plasma processor 220 and a second plasma processor 230.

The deposition apparatus 200 may further include a chamber (not shown) for effectively controlling atmosphere of a deposition process.

The injection unit 210 injects a deposition source material into a substrate (not shown) to form a deposition film on the substrate, which is a deposition target object.

In such an embodiment, the injection unit 210 includes a housing 202, and a plasma generating member 212 below the housing 202. The housing 202 includes a supply unit 205 thereon, and a raw material gas is supplied through the supply unit 205. A shape and number of the supply units 205 may be variously determined based on a size of the substrate on which the deposition process is to be performed.

The plasma generating member 212 includes an inlet hole 212a and a nozzle 212b. The nozzle 212b is defined in a bottom portion of the plasma generating member 212 to face the substrate, and the inlet hole 212a is defined opposite to the nozzle 212b, e.g., in a top portion of the plasma generating member 212.

The raw material gas supplied through the supply unit 205 is transmitted to an inner space of the plasma generating member 212 through the inlet hole 212a. The raw material gas is converted to a deposition source material in a radical form by the plasma generating member 212, and the deposition source material is transmitted to the substrate through the nozzle 212b of the plasma generating member 212, thereby forming a deposition film on the substrate.

The plasma generating member 212 may function as an electrode on which a voltage is applied. The plasma generating member 212 may have a hollow pillar shape.

A filament member 211 may be disposed in the plasma generating member 212. In an exemplary embodiment, the filament member 211 is disposed in the inner space of the plasma generating member 212 having the hollow pillar shape. A power source (not shown) for applying a voltage is connected to the filament member 211. Accordingly, heat and thermions are emitted from the filament member 211. The heat and thermions may collide with a gas around the filament member 211 to generate secondary electrons.

The filament member 211 may include one of various materials. In an exemplary embodiment, the filament member 211 may contain a material having a high electron emission coefficient, for example, a metal material or a ceramic material. In one exemplary embodiment, for example, the metal material of the filament member 211 includes tungsten, tantalum, titanium, or a combination thereof. In one exemplary embodiment, for example, the ceramic material of the filament member 211 includes $LaB_6$, BaO, SrO, or a combination thereof.

The filament member 211 is supported by a support bar 215. In an exemplary embodiment, as shown in FIG. 4, the filament member 211 and the support bar 215 are spaced apart from each other. In an alternative exemplary embodiment, the filament member 211 and the support bar 215 may contact each other. Accordingly, the filament member 211 may be stably disposed by the support bar 215. In such an embodiment, the filament member 211 may be wound up on the support bar 215 a plurality of times in a single direction. In one exemplary embodiment, for example, the filament member 211 may have a shape of a coil.

The filament member 211 may include the material having a high electron emission coefficient, and thus emits thermions. Such heat and thermions emitted from the filament member 211 allows the raw material gas received from the inlet hole 212a of the plasma generating member 212 to be efficiently and effectively converted to a radical form. In such an embodiment, an amount of the raw material gas converted to the radical form is increased and a converting speed is increased.

In an exemplary embodiment, as shown in FIG. 4, an intermediate unit 213 may be disposed between the plasma generating member 212 and the filament member 211. In an alternative exemplary embodiment, the intermediate unit 213 may be omitted. In an exemplary embodiment, the intermediate unit 213 may have a hollow pillar shape. The intermediate unit 213 includes a first hole 213a and a second hole 213b. In an exemplary embodiment, as shown in FIG. 4, the intermediate unit 213 includes a plurality of first holes 213a and a plurality of second holes 213b, where the first hole 213a is defined in a region of the intermediate unit 213 close to the supply unit 205, e.g., on a top surface of the intermediate unit 213, and the second hole 213b is defined in a region of the intermediate unit 213 close to the nozzle 212b, e.g., on a bottom surface of the intermediate unit 213.

In an exemplary embodiment, the first hole 213a of the intermediate unit 213 is formed to correspond to the inlet hole 212a of the plasma generating member 212, and the second hole 213b of the intermediate unit 213 is formed to correspond to the nozzle 212b of the plasma generating member 212.

The intermediate unit 213 may allow the raw material gas to uniformly move. In an exemplary embodiment, the first and second holes 213a and 213b of the intermediate unit 213 allows the raw material gas to uniformly move to the filament member 211 without being locally concentrated. In such an embodiment, the deposition source material in the radical form uniformly moves through the first and second holes 213a and 213b of the intermediate unit 213.

The first and second plasma processors 220 and 230 are disposed on two sides of the injection unit 210, respectively. In an exemplary embodiment, the first and second plasma processors 220 and 230 may be disposed adjacent to the injection unit 210 and to respectively face two opposing sides of the injection unit 210.

The first plasma processor 220 includes a base member 221 and an electrode member 222. The electrode member 222 generates plasma, and the base member 221 supports the electrode member 222.

In an exemplary embodiment, the base member 221 includes a through hole 226 defined thereon to receive a reaction gas for generating plasma through the through hole 226. The electrode member 222 generates plasma using the reaction gas. In one exemplary embodiment, for example, plasma may be generated in a reaction space 220s between the base member 221 and the electrode member 222. In such an embodiment, a diffuser 224 may be disposed adjacent to the through hole 226 such that the reaction gas is uniformly dispersed through the through hole 226. The diffuser 224 includes a plurality of dispersion holes 224a. The electrode member 222 may include a cooling line 223 disposed an inside thereof or defined therein to effectively control a temperature.

The electrode member 222 includes a plurality of slits 222a. Plasma is generated in the reaction space 220s by the electrode member 222. Radicals, ions and other gases, at least a portion of which is in plasma state, move outside the reaction space 220s through the slits 222a, e.g., in a direction towards the substrate. In such an embodiment, the reaction gas that moves outside the reaction space 220s through the slits 222a may additionally be converted to radicals and ions through plasma generation by the electrode member 222.

The base member 221 may have a box-like shape to define and limit the reaction space 220s between the through hole 226 and the electrode member 222. Accordingly, the reaction space 220s may be separated from the injection unit 210.

The second plasma processor 230 includes a base member 231 and an electrode member 232. The electrode member 232 generates plasma, and the base member 231 supports the electrode member 232.

In an exemplary embodiment, the base member 231 includes a through hole 236 defined thereon to receive a reaction gas for generating plasma through the through hole 236. The electrode member 232 generates plasma using the reaction gas. In an exemplary embodiment, for example, plasma may be generated in a reaction space 230s between the base member 231 and the electrode member 232. In such an embodiment, a diffuser 234 may be disposed adjacent to the through hole 236 such that the reaction gas is uniformly dispersed through the through hole 236. The diffuser 234 includes a plurality of dispersion holes 234a. The electrode member 232 may include a cooling line 233 disposed an inside thereof or defined therein to effectively control a temperature.

The electrode member 232 includes a plurality of slits 232a. Plasma is generated in the reaction space 230s by the electrode member 232. Radicals, ions and other gases, at least a portion of which is in plasma state, move outside the reaction space 230s through the slits 232a, e.g., in a direction towards the substrate. In such an embodiment, the reaction gas moved outside the reaction space 230s through the slits 232a may additionally convert to radicals and ions via plasma generation by the electrode member 232.

The base member 231 may have a box-like shape to define and limit the reaction space 230s between the through hole 236 and the electrode member 232. Accordingly, the reaction space 230s may be separated from the injection unit 210.

The base member 221, the housing 202 and the base member 231 may be integrally formed as a single unitary and indivisible unit. Accordingly, the first plasma processor 220, the injection unit 210 and the second plasma processor 230, which are arranged in a same direction, may be efficiently manufactured. Also, durability of the deposition apparatus 200 is substantially improved.

The first or second plasma processor 220 or 230 performs a plasma process on the deposition film using the deposition source material in the radical form on the substrate S through the injection unit 210. In such an embodiment, by performing the plasma process on the deposition film formed through the injection unit 210, purity of the deposition film may be substantially improved and impurities may be effectively removed from the deposition film, thereby substantially improving characteristics of the deposition film.

The deposition process may be performed on the substrate as the substrate moves with respect to the deposition apparatus 200 as described above.

Operations and effects of such an embodiment of the deposition apparatus 200 shown in FIGS. 3 to 5 will now be described in detail.

In such an embodiment, a raw material gas is supplied through the supply unit 205 of the injection unit 210. The raw material gas is transmitted into the plasma generating member 212 through the inlet hole 212a. The plasma generating member 212 converts at least some of the raw material gas to the deposition source material in the radical form. The deposition source material is injected into the substrate through the nozzle 212b, thereby forming a deposition film. In such an embodiment, heat and thermions emitted from the filament member 211 improve the converting efficiency of the raw material gas to the radical form. Accordingly, the characteristics of the deposition film are substantially improved. Also, a gas and radicals move substantially uniformly through the intermediate unit 213.

The first and second plasma processors 220 and 230 are disposed adjacent to the injection unit 210 and generate plasma such that the converting efficiency of the raw material gas to the radical form substantially increases.

In an exemplary embodiment, the first and second plasma processors 220 and 230 respectively include the reaction spaces 220s and 230s such that plasma is mainly generated in the reaction spaces 220s and 230s. Accordingly, the substrate is effectively prevented from being damaged by directly colliding with plasma, and the characteristics of the deposition film are substantially improved.

In an exemplary embodiment, where the base members 221 and 231 of the first and second plasma processors 220 and 230 each have a box-like shape, the reaction spaces 220s and 230s are separated from the injection unit 210, and thus a reaction process in the injection unit 210 may be efficiently controlled.

Figure 6:
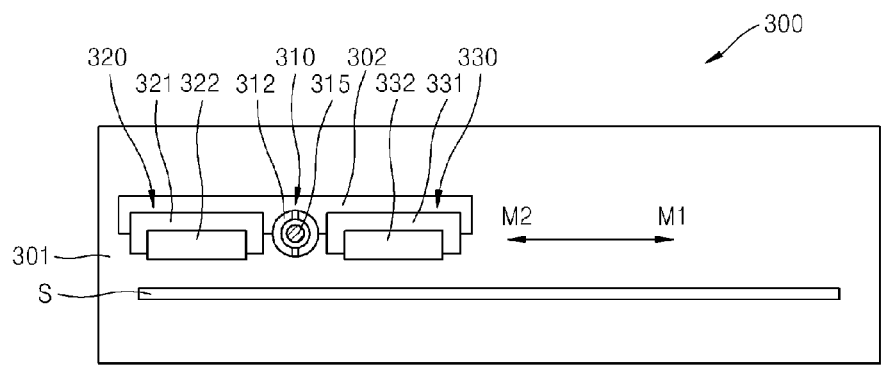
FIG. 6 is a schematic diagram showing another alternative exemplary embodiment of a deposition apparatus, according to the invention.

FIG. 6 is a schematic diagram showing another alternative exemplary embodiment of a deposition apparatus 300, according to the invention. The exemplary embodiment of the deposition apparatus 300 shown in FIG. 6 is substantially the same as the exemplary embodiments of the deposition apparatus 100 or 200 shown in FIGS. 1 to 5, and any repetitive detailed description of the same or like elements thereof will hereinafter be omitted or simplified for convenience of description.

Referring to FIG. 6, an exemplary embodiment of the deposition apparatus 300 includes an injection unit 310 and a plasma processor. The plasma processor includes a first plasma processor 320 and a second plasma processor 330.

The deposition apparatus 300 may further include a chamber 301 to effectively control the atmosphere of a deposition process. In an exemplary embodiment, as shown in FIG. 6, the injection unit 310 and the first and second plasma processors 320 and 330 may be disposed inside the chamber 301. The chamber 301 may be connected to a pump (not shown) to control a pressure atmosphere of the deposition processor, and may include an entry hole (not shown), through which the substrate S may enter into the chamber 301.

The injection unit 310 injects a deposition source material onto the substrate S to form a deposition film on the substrate S. A structure of the injection unit 310 is similar to the injection unit of an exemplary embodiment of the deposition apparatus described above. The injection unit 310 includes a housing 302 and a plasma generating member 312 below the housing 302. In such an embodiment, a filament member (not shown) may be disposed in the plasma generating member 312, and the filament member may be supported by a support bar 315. In such an embodiment, an intermediate unit (not shown) may be disposed between the plasma generating member 312 and the filament member.

The first and second plasma processors 320 and 330 are disposed on two sides of the injection unit 310, respectively. In such an embodiment, the first and second plasma processors 320 and 330 may be disposed adjacent to the injection unit 310 and to face two opposing sides of the injection unit 310, respectively.

The first plasma processor 320 includes a base member 321 and an electrode member 322. The electrode member 322 generates plasma. The base member 321 supports the electrode member 322. The second plasma processor 330 includes a base member 331 and an electrode member 332. The electrode member 332 generates plasma. The base member 331 supports the electrode member 332. Although not illustrated in FIG. 6, the first and second plasma processors 320 and 330 may have the substantially the same structures as the first and second plasma processors 220 and 230 shown in FIG. 3.

The housing 302 is connected to the base member 321 and the base member 331. In such an embodiment, the housing 302, the base member 331 and the electrode member 332 may be integrally formed as a single unitary and indivisible unit.

In an exemplary embodiment, as shown in FIG. 6, the deposition process is performed as the injection unit 310, the first plasma processor 320 and the second plasma processor 330 move in the first and second directions M1 and M2 with respect to the substrate S. In such an embodiment, the injection unit 310, the first plasma processor 320 and the second plasma processor 330 integrally move while the deposition process is performed. A driving unit (not shown) may be disposed on the housing 302 to move the injection unit 310, the first plasma processor 320 and the second plasma processor 330. The driving unit may include a driving motor (not shown) and a driving guide (not shown).

Figure 7:
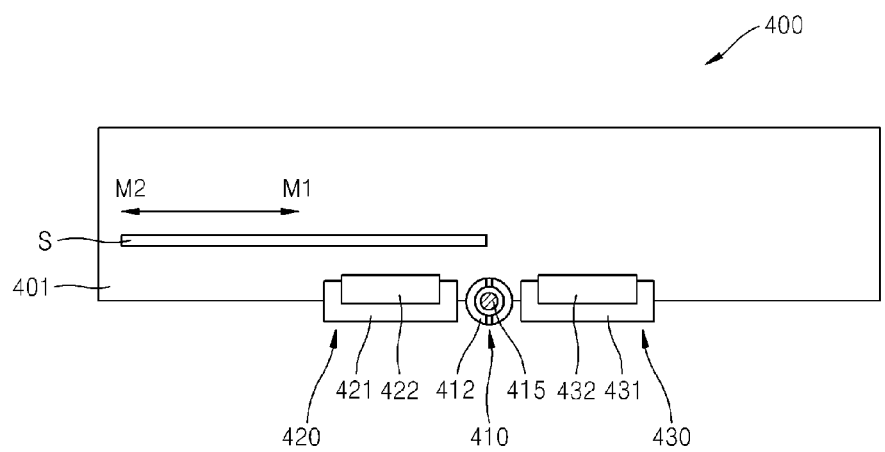
FIG. 7 is a schematic diagram showing another alternative exemplary embodiment of a deposition apparatus, according to the invention.

FIG. 7 is a schematic diagram showing another alternative exemplary embodiment of a deposition apparatus 400, according to the invention.

Referring to FIG. 7, the deposition apparatus 400 includes an injection unit 410 and a plasma processor. The plasma processor includes a first plasma processor 420 and a second plasma processor 430.

In the exemplary embodiment described with reference to FIG. 1, the deposition process may be performed as the substrate S moves in the first or second direction M1 or M2 while the substrate S is disposed below the injection unit 110 and the first and second plasma processors 120 and 130. In such an embodiment, the injection unit 110 and the first and second plasma processors 120 and 130 are disposed farther from a surface of a ground than the substrate S. However, embodiments of the invention are not limited thereto.

In an alternative exemplary embodiment, as shown in FIG. 7, the deposition process may be performed while the substrate S is disposed over the injection unit 410 and the first and second plasma processors 420 and 430. In such an embodiment, the injection unit 410 and the first and second plasma processors 420 and 430 are disposed closer to the ground than the substrate S.

In such an embodiment, the injection unit 410 includes a housing 402 and a plasma generating member 412, and each of the first and second plasma processors 420 and 430 includes a base member 421 or 431, and an electrode member 422 or 432. In such an embodiment, a filament member (not shown) may be disposed in the plasma generating member 412, and the filament member may be supported by a support bar 415.

The injection unit 410 (and the first and second plasma processors 420 and 430 may have substantially the same structures as the injection unit 110, 210 or 310 and the first and second plasma processors 120 and 130, 220 and 230, or 320 and 330 of the exemplary embodiments of the deposition apparatus described above.

In an alternative exemplary embodiment, instead of moving the substrate S, the injection unit 410 and the first and second plasma processors 420 and 430 may be moved.

Figure 8:
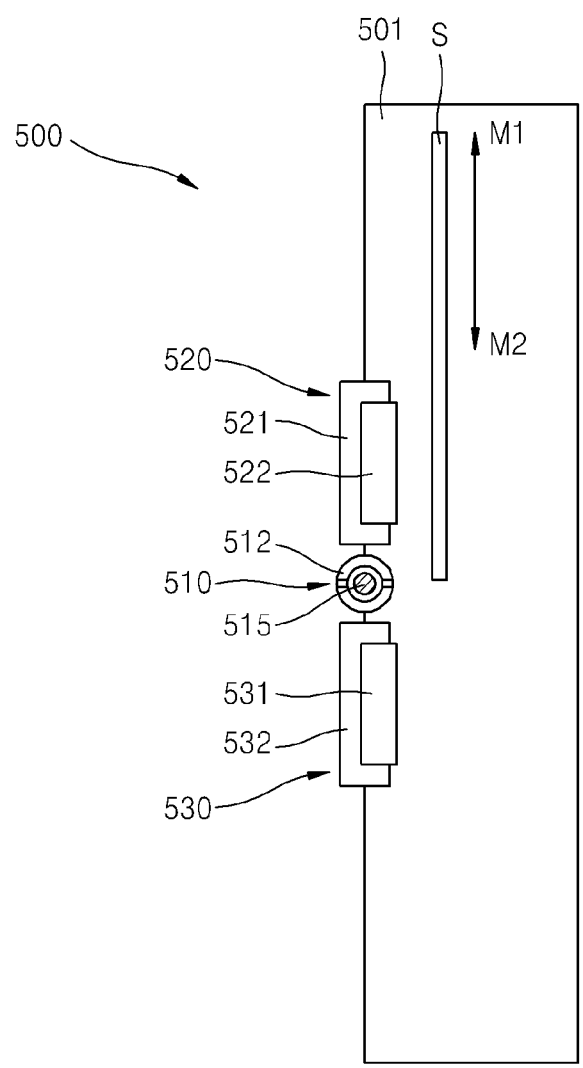
FIG. 8 is a schematic diagram showing another alternative exemplary embodiment of a deposition apparatus, according to the invention.

FIG. 8 is a schematic diagram showing another alternative exemplary embodiment of a deposition apparatus 500, according to the invention.

Referring to FIG. 8, the deposition apparatus 500 includes an injection unit 510 and a plasma processor. The plasma processor includes a first plasma processor 520 and a second plasma processor 530.

In the exemplary embodiment described with reference to FIG. 1, the deposition process is performed as the substrate S moves in the first or second direction M1 or M2 while the substrate S is disposed below the injection unit 110 and the first and second plasma processors 120 and 130. In such an embodiment, the injection unit 110 and the first and second plasma processors 120 and 130 are disposed farther from the ground than the substrate S. However, embodiments of the invention are not limited thereto.

In an alternative exemplary embodiment, as shown in FIG. 8, the deposition process may be performed while the injection unit 510 and the first and second plasma processors 520 and 530 may be disposed substantially perpendicular to the ground, and the substrate S is also disposed substantially perpendicular to the ground.

In such an embodiment, the injection unit 510 includes a housing 502 and a plasma generating member 512, and each of the first and second plasma processors 520 and 530 includes a base member 521 or 531, and an electrode member 522 or 535. In such an embodiment, a filament member (not shown) may be disposed in the plasma generating member 512, and the filament member may be supported by a support bar 515.

The injection unit 510 and the first and second plasma processors 520 and 530 may have substantially the same structures as the injection unit 110, 210 or 310 and the first and second plasma processors 120 and 130, 220 and 230, or 320 and 330 of the exemplary embodiments of the deposition apparatus described above.

In an alternative exemplary embodiment, instead of moving the substrate S, the injection unit 510 and the first and second plasma processors 520 and 530 may be moved.

Figure 9:
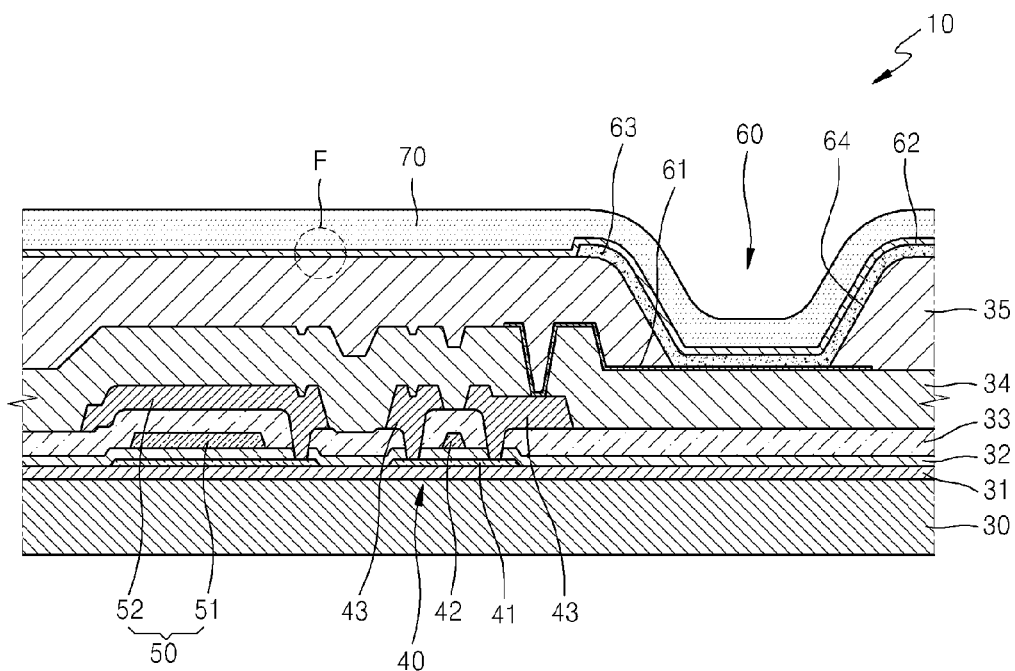
FIG. 9 is a cross-sectional view schematically illustrating an exemplary embodiment of an organic light emitting display apparatus manufactured using a deposition apparatus, according to the invention.
Figure 10:
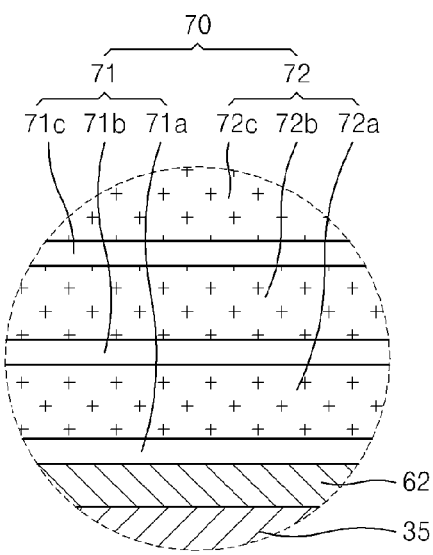
FIG. 10 is an enlarged view of a region F of FIG. 9.

FIG. 9 is a cross-sectional view schematically illustrating an exemplary embodiment of an organic light emitting display apparatus 10 manufactured using a deposition apparatus, according to the invention, and FIG. 10 is an enlarged view of a region F of FIG. 9.

Referring to FIGS. 9 and 10, the organic light emitting display apparatus 10 includes a substrate 30. The substrate 30 may include a glass material, a plastic material or a metal material, for example.

A buffer layer 31 for providing a flat surface on the substrate 30 and including an insulating material to effectively prevent moisture and foreign materials from penetrating into the substrate 30 is provided, e.g., formed, on the substrate 30.

A thin film transistor ("TFT") 40, a capacitor 50 and an organic light emitting device 60 are provided on the buffer layer 31. The TFT largely includes an active layer 41, a gate electrode 42 and a source/drain electrode 43. The organic light emitting device 60 includes a first electrode 61, a second electrode 62 and an intermediate layer 63. The capacitor 50 includes a first capacitor electrode 51 and a second capacitor electrode 52.

In such an embodiment, the active layer 41 having a predetermined pattern is provided on a top surface of the buffer layer 31. The active layer 41 may include an inorganic semiconductor material, such as silicon, an organic semiconductor material, or an oxide semiconductor material, for example, and may be formed by selectively injecting a p-type or n-type dopant.

A gate insulating film 32 is provided on the active layer 41. The gate electrode 42 is provided on the gate insulating film 32 to correspond to the active layer 41. The first capacitor electrode 51 may be provided on the gate insulating film 32 using substantially the same material as the gate electrode 42.

An interlayer insulating film 33 is provided to cover the gate electrode 42, and the source/drain electrode 43 is provided on the interlayer insulating film 33 while contacting a predetermined region of the active layer 41. The second capacitor electrode 52 may be provided on the interlayer insulating film 33 using substantially the same material as the source/drain electrode 43.

A passivation layer 34 is provided to cover the source/drain electrode 43, and a separate insulating film (not shown) may be further provided on the passivation layer 34 to flatten the TFT 40.

The first electrode 61 is provided on the passivation layer 34. The first electrode 61 is electrically connected to any one of the source/drain electrode 43. Then, a pixel defining film 35 is provided to cover the first electrode 61. An opening 64 is formed on the pixel defining film 35, and then the intermediate layer 63 including an organic emission layer is provided in a region limited by the opening 64. The second electrode 62 is provided on the intermediate layer 63.

An encapsulation layer 70 is provided on the second electrode 62. The encapsulation layer 70 may include an organic or inorganic material, or may have a structure, in which an organic material and an inorganic material are alternately stacked on each other.

In an exemplary embodiment, the encapsulation layer 70 may be provided using one of the exemplary embodiments of the deposition apparatus 100 through 500 described above.

In such an embodiment, as shown in FIG. 10, the encapsulation layer 70 includes an inorganic layer 71 and an organic layer 72. The inorganic layer 71 includes a plurality of layers 71a through 71c and the organic layer 72 includes a plurality of layers 72a through 72c.

In such an embodiment, the layers 71a through 71c of the inorganic layer 71 may be formed using one of the exemplary embodiments of the deposition apparatuses 100 through 500 described above. Accordingly, providing the encapsulation layer 70, including providing the inorganic layer 71, may be effectively and efficiently performed. Also, by improving characteristics of the inorganic layer 71, characteristics of the encapsulation layer 70 are improved, and as a result, an encapsulation characteristic of the organic light emitting display apparatus 10 is substantially improved.

However, embodiments of the invention are not limited thereto. In an alternative exemplary embodiment, other insulating films, such as the buffer layer 31, the gate insulating film 32, the interlayer insulating film 33, the passivation layer 34 or the pixel defining film 35 of the organic light emitting display apparatus 10, may be formed using one of the exemplary embodiment of the deposition apparatus 100 through 500 described above.

In an alternative exemplary embodiment, other thin films, such as the active layer 41, the gate electrode 42, the source/drain electrode 43, the first electrode 61, the intermediate layer 63 or the second electrode 62 may be formed using one of the exemplary embodiments of the deposition apparatus 100 through 500 described above.

In such an embodiment, where one of the exemplary embodiments of the deposition apparatus 100 through 500 is used, characteristics of a deposition film of the organic light emitting display apparatus 10 are substantially improved, and as a result, electrical and image quality characteristics of the organic light emitting display apparatus 10 may be substantially improved.

In such an embodiment, a thin film of a liquid crystal display apparatus or a thin film of another display apparatus may be formed using one of the exemplary embodiments of the deposition apparatus 100 through 500, but embodiments of the invention are not limited thereto, and one of the exemplary embodiments of the deposition apparatus 100 through 50 may be used to form a thin film of various purposes.

As described above, according to one or more of the embodiments of the invention described herein, a deposition apparatus, a method of forming a thin film using the deposition apparatus, and a method of manufacturing an organic light emitting display apparatus using the deposition apparatus may efficiently perform a deposition process and effectively improve characteristics of a deposition film.

While one or more embodiments of the invention have been described with reference to the figures, it will be understood by those of ordinary skill in the art that various changes in form and details may be made therein without departing from the spirit and scope of the invention as defined by the following claims.

What is claimed is:

1. A deposition apparatus for performing a deposition process on a substrate, the deposition apparatus comprising:
   an injection unit comprising a plasma generating member which receives a raw material gas and converts the raw material gas to a deposition source material in a radical form; and
   a plasma processor disposed adjacent to the injection unit and facing a side of the injection unit, wherein the plasma processor performs a plasma process in a direction facing the substrate.

2. The deposition apparatus of claim 1, wherein
   the plasma generating member has a hollow pillar shape, and
   the deposition apparatus further comprises a filament member disposed inside the plasma generating member.

3. The deposition apparatus of claim 2, wherein
   the injection unit further comprises a support bar which supports the filament member,
   wherein the filament member is wound up on the support bar.

4. The deposition apparatus of claim 2, further comprising:
   an intermediate unit disposed between the plasma generating member and the filament member, and having a hollow pillar shape.

5. The deposition apparatus of claim 4, wherein
   a plurality of first holes is defined in the intermediate unit in a region facing the substrate, and
   a plurality of second holes is defined in the intermediate unit in a region facing away from the substrate.

6. The deposition apparatus of claim 1, wherein the plasma generating member comprises:
   a nozzle facing the substrate; and
   an inlet hole facing away from the substrate.

7. The deposition apparatus of claim 1, wherein the plasma generating member receives a voltage.

8. The deposition apparatus of claim 1, wherein the plasma processor comprises a first plasma processor and a second plasma processor, which are disposed on two sides of the injection unit, respectively.

9. The deposition apparatus of claim 1, wherein
   the deposition process is performed on the substrate as the substrate moves with respect to the deposition apparatus, and
   the plasma processor is disposed on a side of the injection unit substantially in parallel to a moving direction of the substrate.

10. The deposition apparatus of claim 1, wherein
    the deposition process is performed on the substrate as the injection unit and the plasma processor integrally move with respect to the substrate, and
    the plasma processor is disposed on a side of the injection unit substantially in parallel to a moving direction of the injection unit and plasma processor.

11. The deposition apparatus of claim 1, wherein the plasma processor comprises:
    an electrode member which generates plasma; and
    a base member which supports the electrode member.

12. The deposition apparatus of claim 11, wherein
    a reaction space is defined between the electrode member and the base member, wherein the plasma is generated in the reaction space.

13. The deposition apparatus of claim 12, wherein the reaction space is separated from the injection unit.

14. The deposition apparatus of claim 11, wherein
a through hole is defined in the base member, and
a reaction gas to generate the plasma is supplied through the through hole.

15. The deposition apparatus of claim 11, further comprising:
a diffuser disposed between the base member and the electrode member, wherein a plurality of dispersion holes are defined on the diffuser.

16. The deposition apparatus of claim 11, wherein the electrode member comprises a cooling line disposed an inside thereof.

17. The deposition apparatus of claim 11, wherein
the injection unit comprises a housing disposed to correspond to a surface of the plasma generating member, and
the base member and the housing are integrally formed as a single unitary and indivisible unit.

18. The deposition apparatus of claim 11, wherein a plurality of slits is defined in the electrode member.

19. The deposition apparatus of claim 1, wherein the injection unit and the plasma processor are disposed closer to or farther from a surface of a ground than the substrate.

20. The deposition apparatus of claim 1, wherein the injection unit, the plasma processor and the substrate are disposed substantially perpendicular to a surface of a ground.

21. A method of forming a thin film on a substrate using a deposition apparatus, the method comprising:
receiving a raw material gas, converting the raw material gas to a deposition source material in a radical form, and supplying the deposition source material to the substrate using a plasma generating member of an injection unit of the deposition apparatus; and
performing a plasma process in a direction facing the substrate using a plasma processor of the deposition apparatus, wherein the plasma processor is disposed adjacent to the injection unit and facing a side of the injection unit.

22. The method of claim 21, wherein the performing the plasma process comprising using the raw material gas.

23. The method of claim 21, wherein the performing the plasma process comprising using a gas different from the raw material gas.

24. The method of claim 21, wherein the performing the plasma process comprising using a gas selected independently of a material in the thin film.

25. The method of claim 21, wherein
the plasma generating member has a hollow pillar shape,
the deposition apparatus comprise a filament member disposed inside the plasma generating member, wherein the filament member emits heat and thermions.

26. A method of manufacturing an organic light emitting display apparatus using a deposition apparatus, the method comprising:
providing a layer on a substrate of the organic light emitting display apparatus,
wherein the providing the layer comprises:
receiving a raw material gas, converting the raw material gas to a deposition source material in a radical form, and supplying the deposition source material to the substrate using a plasma generating member of an injection unit of the deposition apparatus; and
performing a plasma process in a direction facing the substrate using a plasma processor of the deposition apparatus, wherein the plasma processor is disposed adjacent to the injection unit and facing a side of the injection unit.

27. The method of claim 26, wherein
the organic light emitting display apparatus comprises: a first electrode; an intermediate layer comprising an organic emission layer; a second electrode; and an encapsulation layer, and
the providing the layer further comprises providing the encapsulation layer on the second electrode disposed on the substrate.

28. The method of claim 26, wherein the providing the layer further comprises providing an insulating film.

29. The method of claim 26, wherein the providing the layer further comprises providing a conductive film.

* * * * *